(12) United States Patent
Cauchy

(10) Patent No.: US 7,032,389 B2
(45) Date of Patent: Apr. 25, 2006

(54) THERMOELECTRIC HEAT PUMP WITH DIRECT COLD SINK SUPPORT

(75) Inventor: Matt J. Cauchy, Traverse City, MI (US)

(73) Assignee: Thermoelectric Design, LLC, Traverse City, MI (US)

( * ) Notice: Subject to any disclaimer, the term of this patent is extended or adjusted under 35 U.S.C. 154(b) by 19 days.

(21) Appl. No.: 10/735,131

(22) Filed: Dec. 12, 2003

(65) Prior Publication Data
US 2005/0126184 A1    Jun. 16, 2005

(51) Int. Cl.
F25B 21/02    (2006.01)
(52) U.S. Cl. .............................. 62/3.3; 62/3.7
(58) Field of Classification Search ............ 62/3.3, 62/3.7, 3.2, 3.6, 3.64, 440, 443; 136/203, 136/204, 211, 212
See application file for complete search history.

(56) References Cited

U.S. PATENT DOCUMENTS

| | | |
|---|---|---|
| 2,844,638 A | 7/1958 | Lindenblad |
| 2,903,857 A | 9/1959 | Lindenblad |
| 2,997,514 A | 8/1961 | Roeder, Jr. |
| 3,016,715 A | 1/1962 | Pietsch |
| 3,076,051 A | 1/1963 | Haba |
| 3,213,630 A | 10/1965 | Mole |
| 3,290,177 A | 12/1966 | Mole et al. |
| 3,474,632 A | 10/1969 | Newton |
| 3,626,704 A | 12/1971 | Coe, Jr. |
| 4,306,426 A | 12/1981 | Berthet et al. |
| 4,730,459 A | 3/1988 | Schlicklin et al. |
| 5,315,830 A | 5/1994 | Doke et al. |
| 5,367,890 A | 11/1994 | Doke |
| 5,409,547 A | 4/1995 | Watanabe et al. |
| 6,100,463 A | 8/2000 | Ladd et al. |
| 6,226,994 B1 | 5/2001 | Yamada |
| 6,385,976 B1 | 5/2002 | Yamamura et al. |
| 6,574,967 B1 | 6/2003 | Park et al. |
| 6,580,025 B1 | 6/2003 | Guy |
| 6,815,814 B1 * | 11/2004 | Chu et al. .................. 257/722 |
| 6,855,880 B1 * | 2/2005 | Feher ........................ 136/203 |

OTHER PUBLICATIONS

Blankenship, "Application of Thermoelectric Technology to Naval Submarine Cooling", International Thermoelectric Society proc.(?)1988(?) Westinghouse Electric Corp., U.S.

* cited by examiner

Primary Examiner—Chen Wen Jiang
(74) Attorney, Agent, or Firm—Northern Michigan Patent Law, PLC (57) ABSTRACT

A thermoelectric heat pump module of the type used in small cooling applications and appliances, such as a thermoelectric picnic cooler. The module comprises an array of thermoelectric elements with cold-side connectors directly bonded to a large, unitary cold sink for support, and hot-side connectors each having an integrated heat exchange fin to form a small, lightweight, but efficient hot sink array directly bonded to the elements without thermal stress. The cold sink is larger than the hot sink array. The cold-side connectors and at least portions of the thermoelectric elements are sealed and supported with a layer of potting material built up from the surface of the cold sink, and optionally insulated with an additional layer of sealed foam, eliminating moisture vapor transmission, condensation, and corrosion in the module. In a preferred form, the elements and their finned hot-side connectors are arranged in an elongated, narrow-depth array designed to be placed perpendicular to a flow of cooling air, and allowing multiple modules to be used in a distributed pattern with a single air-mover such as a fan.

13 Claims, 7 Drawing Sheets

THERMOELECTRIC HEAT PUMP WITH DIRECT COLD SINK SUPPORT

FIELD OF THE INVENTION

The present invention is in the field of thermoelectric (TE) heat pumps of the type used in smaller scale cooling and heating appliances.

BACKGROUND OF THE INVENTION

TE heat pumps are well known and offer an efficient means for pumping or moving small amounts of heat, generally less than 200 watts. Well known uses include temperature controlling (cooling or heating) small enclosures that contain such items as food, wine, medicine or electronics, and direct temperature control of electronic chips and laser diode devices by direct placement of a TE heat pump on a device. A less well-known application for TE technology is to pump heat through the TE unit to produce electrical power, known as a TE generator.

Figure 1:
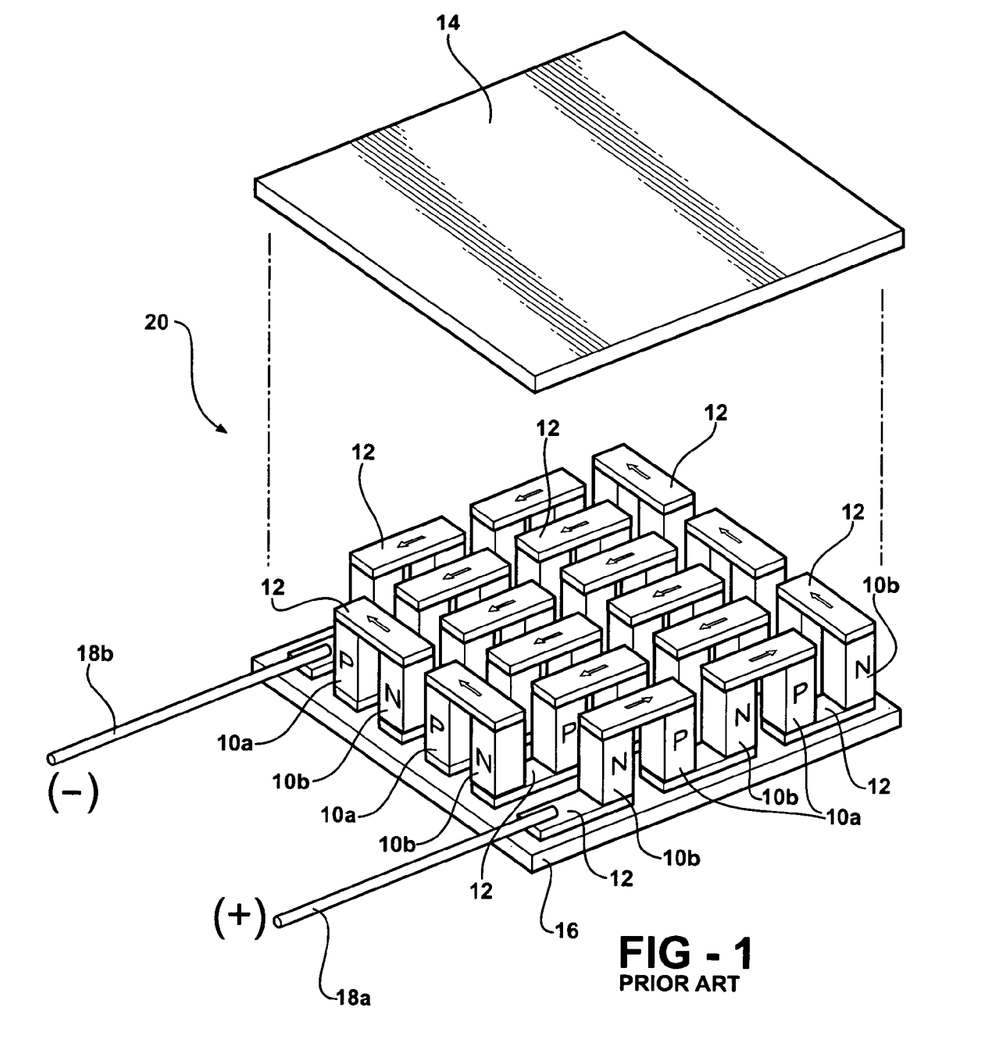
FIG. 1 is a perspective view of a prior art TE module, with the top substrate removed from the cold side for clarity.

A conventional TE device, chip, or module 20 is shown in FIG. 1 with the typical upper alumina substrate 14 removed. The module consists of an array of negatively (N) and positively (P) doped thermoelectric semiconductor elements, 10a and 10b, arranged in pairs or thermocouples with TE elements 10a and 10b connected electrically in series and thermally in parallel. The TE elements are connected electrically by copper connectors such as tabs or bus bars 12. The TE elements and their connectors are in turn sandwiched between the top alumina substrate 14 and a bottom alumina substrate 16. The substrates provide electrical insulation and mechanical support and protection for the TE elements 10a and 10b.

When DC electrical power is applied to such an array of thermocouples via the positive connection wire 18a and the negative connection wire 18b, heat is absorbed on one side (cold side), conducted through the elements by charge carriers, and deposited on the opposite side (hot side). Switching the direction of the DC current will reverse the hot and cold sides. Conversely, putting a temperature differential across the two sides will produce DC electrical power, often called a generator. In FIG. 1, for the current direction shown, substrate 14 is on the cold side of the module where heat is absorbed, and substrate 16 is on the hot side of the module from which heat is rejected.

Figure 2:
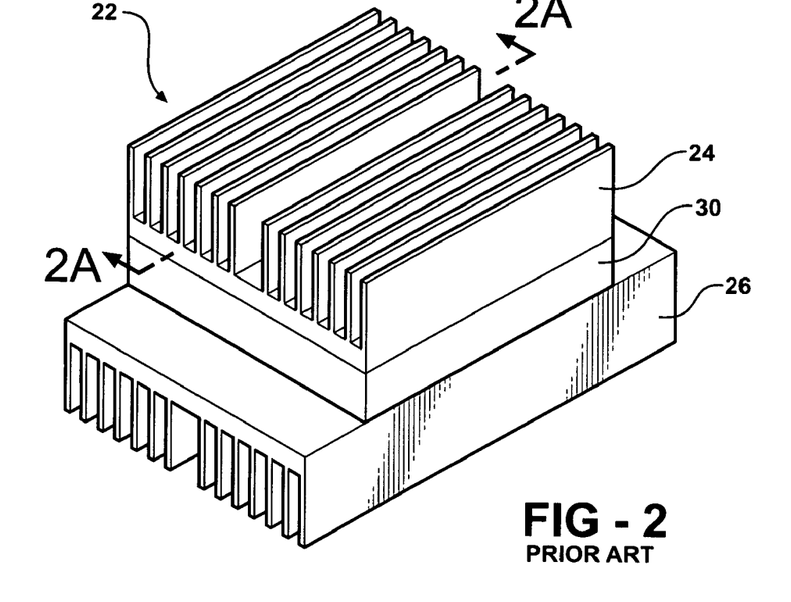
FIG. 2 is a perspective view of a prior art TE heat exchange assembly incorporating the module of FIG. 1.
Figure 2A:
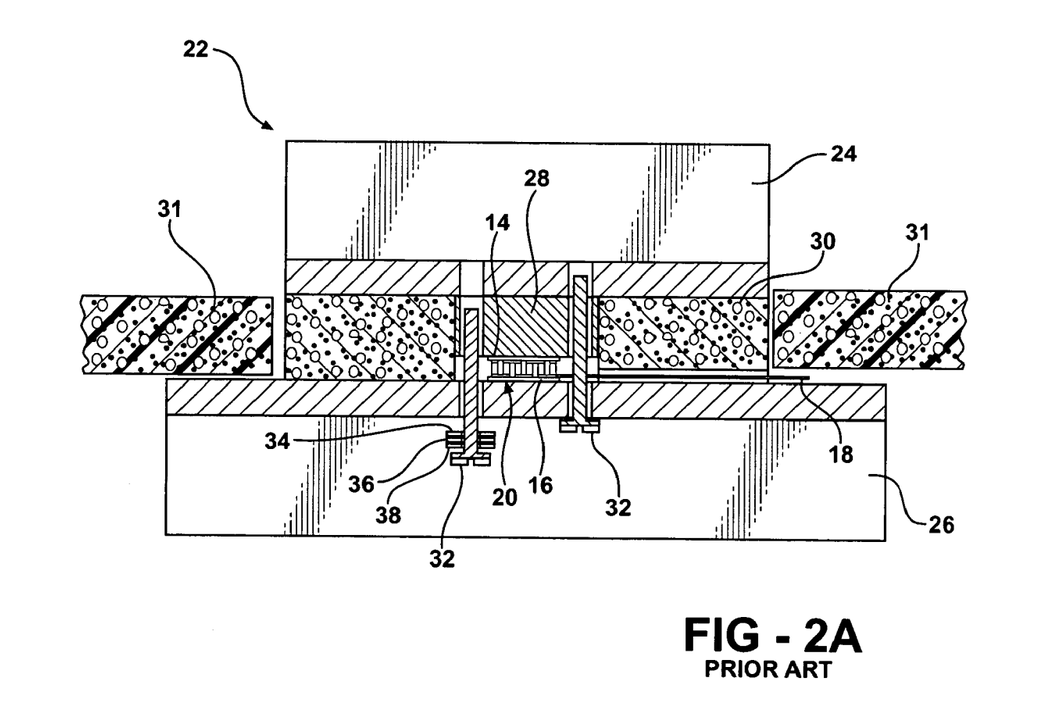
FIG. 2A is a side elevation view, in section, of the assembly of FIG. 2.

FIGS. 2 and 2A show a perspective and a cross-sectional view of a typical TE assembly 22 incorporating TE module 20 from FIG. 1, found in a temperature controlled enclosure such as a cooled portable picnic box. One side is exposed to the interior air and the opposite side is exposed to the ambient air. On the interior side, generally called the cold side, a heat exchanger or cold sink 24 is attached to the top substrate or cold side 14 of module 20 to increase heat transfer to the cold side from the interior air. Similarly a heat exchanger or hot sink 26 is attached to the hot side 16 of the module to increase heat transfer between the hot side 16 and the exterior air. The heat exchangers are generally extended surfaces made of highly heat-conductive material, such as aluminum-finned heat sinks. The hot sink 26 is normally larger than the cold sink 24 as it transfers both the heat pumped from the cold side and the heat generated by the power input into module 20. A means of moving air or other heat-transferring fluid over or across cold sink 24 and especially hot sink 26, such as a fan (not shown) is typically used to improve thermal efficiency. A metal spacer 28 is often placed between the cold side 14 and cold sink 24 to increase the distance between the hot sink 26 and cold sink 24 and thereby reduce parasitic heat transfer between the hot and cold sinks. Insulating foam 30 is often placed or sprayed into this area around the spacer and module as shown to further reduce this unwanted heat transfer. The heat sinks 24 and 26 are generally held against the cold and hot sides or surfaces 14 and 16 of module 20 by use of stainless steel screws 32. A series of insulating, fastening, and Belleville washers 34, 36, 38 are used to insulate and keep the assembly under compression. Interface materials such as thermal grease or compliant thermal pads (not shown) are placed between cold side 14 and spacer 28, between hot side 16 and hot sink 26, and between spacer 28 and cold sink 24 to increase heat transfer by removing or filling small air gaps.

The assembly 22 is typically fit into a hole cut into the insulating walls 31 of the cooled enclosure.

While the above assembly works adequately, those skilled in the art recognize that it has a number of disadvantages.

One disadvantage is the use of the insulating substrates 14 and 16, typically alumina ceramic. The substrates are costly and reduce thermal efficiency by adding resistance to the flow of heat; this resistance to heat flow is called thermal resistance. The alumina substrates are still used in small-scale TE heat pumps for consumer appliances sold today, despite decades of trying to minimize thermal resistance by removing electrical insulators from the TE module and connecting the TE elements directly to the heat sinks and thereby combine the heat sink and electrical connector functions. For example, U.S. Pat. No. 2,903,857 to Lindenblad (1959) discloses an extremely large TE heat pump, intended for regulating room temperature in homes, in which each thermoelectric pair of TE elements is bonded directly to an individual or discrete heat sink in the form of a large, generally U-shaped channel member on one side, and to individual, spaced cold sink plates on the other. Multiple channel members are then bolted together in series for increased heating and cooling capacity, and to define an elongated airflow path through the series-connected channels. The disadvantages to this design are that it does not lend itself to moisture sealing, has poor structural support for the huge hot sinks, and relies on flexible electrical connections between the spaced cold sink plates in each TE pair to protect the TE elements from thermal stresses. Lindenblad's assembly also appears to rely on an inadequate natural, fanless convection to remove heat from the interconnected hot sinks, possibly due to a widely held belief at the time that the efficiency of the TE materials would improve by orders of magnitude, which large improvement never occurred.

U.S. Pat. No. 2,997,514 to Roeder (1961) discloses an assembly that again bonds discrete heat sinks to the TE elements, but addresses the sealing and structural issues with expensive and thermally resistive spring contact members and impractical packaging of the assembly.

U.S. Pat. No. 3,076,051 to Haba (1963) discloses a different approach that minimizes the thermal resistance of the electrical insulator rather than eliminating it. Haba does this by making the alumina insulating layer extremely thin by means of anodized aluminum plates. One problem with this approach is that the aluminum has three to four times the thermal expansion of alumina ceramic and causes stress fractures of the solder bonds that connect the TE elements to the copper connectors upon heating and cooling.

Several types of structure for the so-called "Direct Transfer Method" have been proposed in patents such as U.S. Pat. No. 3,213,630 to Mole (1963), U.S. Pat. No. 4,730,459 to Schicklin et al. (1988), the published article in International Thermoelectric Society proceedings entitled "Application of Thermoelectric Technology to Naval Submarine Cooling" by Blankenship et al. (1988), and U.S. Pat. No. 6,385,976 to Yamamura et al. (2002). The Direct Transfer Method bonds a heat sink to the TE elements utilizing the walls of metal conduits as the electrical connectors, while the conduit interior conducts heat transfer fluid. Although used successfully in large-scale applications such as the cooling of trains and submarines, this technique is prohibitively expensive and complex in small-scale applications, particularly in consumer products.

U.S. Pat. No. 6,226,994 to Yamada et al. (2001) also discloses a basic "double skeleton" thermoelectric structure without the conventional substrates. The structure consists of TE elements protruding through a partition, the connecting electrodes on one side having an inverted, fluid-cooled T-shape, the structure believed to be especially intended for use with liquid-cooled systems. This basic structure is believed to be relatively fragile and difficult to ship and handle for assembly. While Yamada et al. focuses on liquid-cooled arrangements, the less-detailed air-cooled embodiments replace the T-shaped electrodes with conventional flat electrodes bonded directly to a conventional unitary hot sink with a conventional insulating layer, similar to the Haba structure described above and believed to have similar stress problems. Sealing of the TE elements and their electrodes against moisture and corrosion is not adequately addressed. Air cooling is not believed to be practical with any of Yamada et al's disclosed structures, since the cooling flow path and electrode orientation would reduce efficiency by causing pressure drop, by raising the delta temperature of both the TE elements and their electrodes across the array, and by presenting an inefficient fan interface.

A second important disadvantage of known TE module construction is the corrosion and corresponding thermal performance degradation resulting from moisture condensing on the cold side elements. Water vapor is a relatively small molecule and permeates most module packaging materials other than glass or metal. As small voids or spaces around the cold-side surfaces cool, the water vapor in the spaces condenses to liquid water and lowers the vapor pressure. This creates a vapor pressure gradient where the high-pressure vapor on the exterior of the hot side of the module is pushed toward the lower pressure vapor on the cold side, and then condenses. Vapor thereby moves through interstitial areas in screw threads, connector wires, and insulation foams and condenses on the cold side. The liquid water is then trapped in the open spaces of the module, causing corrosion and parasitic heat losses.

One typical solution to the condensation/corrosion problem is to seal the perimeter of the TE module or its foam packaging assembly and all ingress points such as screws or wires with sealant materials such as epoxy or silicone. This solution is time-consuming, expensive, and prone to leaks. A second solution is to let the vapor in, but provide an exit for condensed water via weep holes or wicking materials. This solution is hard to implement with conventional TE modules, since the elements are close together and sandwiched between the two alumina substrates, such that surface tension tends to keep the water inside the module.

Another disadvantage with known TE module construction is the thermal expansion and contraction of materials. TE heat pump materials, like other electronic materials, have different rates of thermal expansion upon heating or cooling. This difference creates stresses that reduce the life of the module by breaking the solder bonds that connect the elements to the copper conductors. This problem is compounded by the fact that one side is heating and expanding while the other side is cooling and contracting. This difference in expansion and contraction is particularly troublesome in applications that experience wide and/or fast variations in temperature.

Yet another disadvantage with known TE module construction is that the process of combining the TE modules and heat sinks is time-consuming and error prone. Time-consuming procedures must be used to guarantee that uneven pressure from the screw assembly does not damage the brittle TE module. Processes must be implemented to insure the flatness and cleanliness of the mating surfaces, since the thermal performance is extremely sensitive to any dirt, dust, debris, bumps, irregularities, or non-flat areas on or between the mating surfaces of the TE module and heat sink.

BRIEF SUMMARY OF THE INVENTION

The present invention is a TE module assembly that eliminates expensive and thermally inefficient electrically-insulating substrates, is inexpensively and effectively sealed against moisture and moisture vapor, reduces internal thermal stress on the TE elements and their connections caused by thermal expansion, and increases reliability and reduces cost by simplifying assembly procedures.

The module includes an array of TE elements and hot and cold sinks bonded directly to the elements. Primary structural support for the TE elements is supplied by a rigid, unitary cold sink to which the cold side connectors of the TE elements are bonded in common. In a further preferred form, support is additionally or alternately provided by a cold-side-based moisture vapor potting layer that encloses and seals the cold-side connectors and some or all of the TE elements.

Another aspect of the invention is an elongated array of heat-exchanging hot side connectors or "connector sinks" each independently connected to an adjacent pair of TE elements. The TE elements and their connector sinks are arrayed in one or more parallel rows in which the rows are perpendicular to the flow of a cooling fluid such as air, while the connector sinks themselves preferably have cooling fins parallel to the cooling flow. The rows are longer than the depth of the array, such that the array might be only one or two rows of TE elements deep but many elements long. The resulting hot sink has a desirable low thermal resistance and is virtually immune to thermal stress on its connections to the TE elements. The resulting hot sink also lends itself to being coupled with one or more additional such hot sinks in serial or surrounding combinations relative to the cooling flow.

The hot sink array also lends itself well to having the hot sides of the TE elements and their connector sink base tabs sealed and supported by the potting layer extending from the cold side. The surface of the cold sink to which the TE elements are bonded preferably has greater dimensions than the TE element and hot sink array, such that the potting layer is built on the cold sink in a manner surrounding the TE elements and the base of the hot sink array. The cold sink and potting layer accordingly establish a strong, pedestal-like support structure for the TE elements and their hot and cold side connectors that is both sealed and resistant to thermal stress.

These and other features and advantages of the invention will become apparent upon further reading of the specification, in light of the accompanying drawings.

DETAILED DESCRIPTION OF THE INVENTION

Figures 3, 3A, 3B:
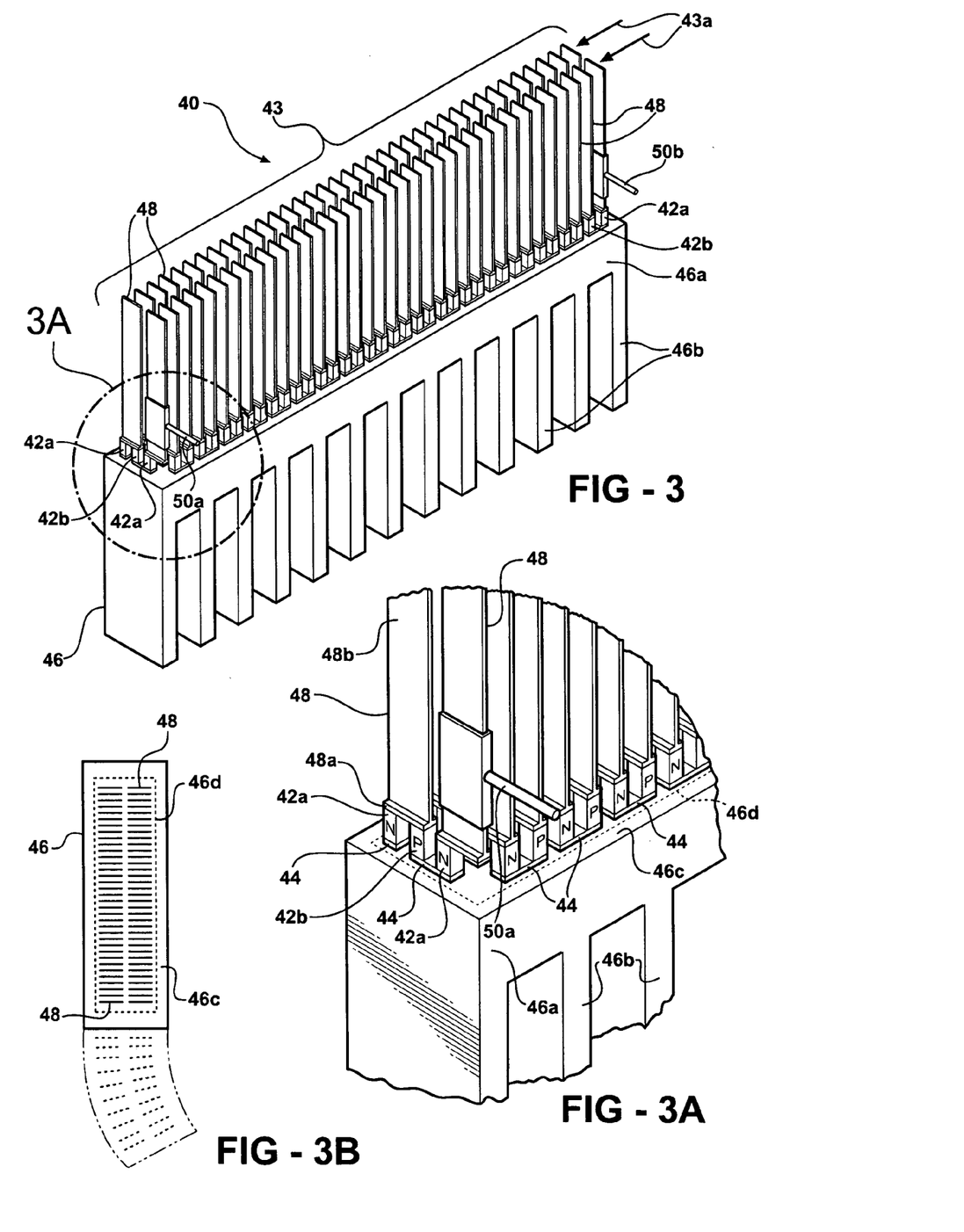
FIG. 3 is a perspective view of a TE heat exchange module according to the invention.
FIG. 3A is a detailed perspective view of a portion of the module of FIG. 3.
FIG. 3B is a schematic plan view of the module of FIG. 3, viewed from the hot sink side, with an alternate curved, extended shape shown in phantom.

FIGS. 3, 3A, and 3B show a preferred basic embodiment of the invention, illustrated as an integrated thermoelectric (TE) assembly or module 40. The typical alumina substrates have been eliminated. An array of N and P thermoelectric semiconductor elements 42a and 42b of conventional type has their heat-absorbing or "cold side" ends (the lower ends of the elements in FIGS. 3 and 3A) connected by flat copper connector tabs 44. The connector tabs 44, however, are bonded directly to a rigid, unitary cold sink 46, in the illustrated embodiment a one-piece extruded block of aluminum cut and anodized, with a thick spacer portion 46a and a plurality of heat exchanging fins 46b. Spacer portion 46a has a mounting/support surface 46c with an area preferably greater than the area 46d (FIG. 3B, broken lines) bounding the array of P/N elements 42a and 42b. Cold-side connectors 44 are preferably attached to cold sink 46 with a thermally conductive adhesive (not shown) in known manner, and to TE elements 42a and 42b with solder (not shown) in known manner. The anodized aluminum layer, for example on the order of one mil (0.001 inches) thick versus the typical 25-35 mil substrate, electrically insulates the connectors 44 from each other to prevent a short circuit.

The upper ends of TE elements 42 in FIGS. 3 and 3A are the heat-rejecting or "hot side" ends, bonded or attached directly to electrically conductive, heat-exchanging connector sinks 48. Connector sinks 48 have tab-like base ends 48a bridging adjacent pairs of elements 42, preferably attached by solder to elements 42, and vertical fins 48b extending perpendicularly from bases 48a. Each connector sink 48 is an individual member, and is preferably formed from the same metal or alloy as cold side connectors 44. Fins 48b preferably have a length several times the height of TE elements 42. While fins 48b are illustrated as preferred thin, flat, planar members, other shapes and thicknesses of fin including but not limited to pins or rods, ovoid wings, tubes and bars are possible.

TE elements 42 and connector sinks 48 are arranged in an elongated, preferably rectangular array 43 for a cooling air flow to flow across the short dimension of the array, perpendicular to the array 43 but parallel to fins 48b. In the illustrated embodiment the array consists of two rows 43a whose length is greater than the four-element depth of the array. It will be understood that different numbers of rows can be used, and that the relative greater length of the array versus its depth can vary. While two or more rows of TE elements is currently preferred, it will be understood that a single row of TE elements can be used, for example with connector sinks having differently shaped or oriented fin members such as the pin-type mentioned above to accommodate the different orientation of the connector sink bases to the cooling flow across the array.

The TE elements 42 in array 43 are powered through direct-current electrical terminals 50a and 50b, connected to the connector sinks 48 at each end of the array. TE elements 42 in the illustrated embodiment are bismuth telluride-based semiconductors typically used for low temperature (less than 100° Celsius) cooling applications, but other thermoelectric materials including those used for higher temperature applications could be used. Both the bismuth telluride material and the PIN elements themselves are commercially available. The size and number of elements 42 and the resulting array 43 can vary depending on the heating or cooling application. The size of the elements dictates the amount of current or heat pumping, and in the illustrated embodiment are typically-sized on the order of 0.050 to 0.100 inches tall and with an area on the order of 0.0009 to 0.0031 square inches. The number of elements dictates the direct current voltage required to power the TE module, and in the illustrated embodiment are a typical number somewhere between 36 and 254 elements.

While the rectangular module array 43 shown in FIGS. 3 and 3A is highly preferred and believed to be inventive in its own right, it will be understood that other patterns could be used, or that the straight, finite-length array 43 could be extended and bent or curved (as shown in phantom in FIG. 3B) or even closed into a fan-surrounding shape such as a circle. An elongated, narrow array such as 43 placed perpendicular to the cooling airflow increases thermal efficiency for several reasons. The efficiency of the air mover (such as a fan) is increased, since the pressure drop across the short direction of a rectangle (or similar narrow-width array) is smaller than that across the typical square pattern and therefore allows more air to flow through the array for the same power. The efficiency of heat transfer is increased by lowering the temperature rise of the air absorbing the heat, since there is more air flowing through the array due to the reduced pressure drop as described above. And, the temperature variation between the first elements to encounter the cooling flow and the last elements is reduced compared to the typical square array, allowing for optimization of the TE elements' voltage and current.

The spacing of TE elements 42 in array 43 is preferably arranged to reduce the area or space between the elements, thereby reducing parasitic heat flow from the hot side back to the cold side. For example, the spaces between the elements in the illustrated embodiment are on the order of 0.025 to 0.050 inches.

The material used for connectors 44 is preferably an electroless nickel-plated copper. Copper provides excellent electrical and thermal conduction while offering good solderability after nickel plating. The plating provides corrosion protection for the copper. The connectors 44 in the illustrated embodiment are, for example, 0.005 to 0.020 inches thick and can be fabricated by stamping, etching or other known machining processes.

Connector sinks 46 are also preferably made from an electroless nickel-plated copper for excellent electrical and thermal conduction. The connector sinks 48 function as both electrical connectors and heat exchangers to the ambient air. FIG. 3A shows the preferred structure of the connector sink 48 as an inverted T, with base 48a similar in size and thickness to connectors 44, and with the vertical fins 48b generally being several times longer and thinner than bases 48a. The dimensions of the connector sinks 48 will vary depending on the temperature control application. As illustrated in the drawings, the fins 48b of the connector sinks in array 43 are preferably parallel to the cooling airflow and to one another, and the fins in one row may be aligned with or staggered relative to the fins in adjacent rows. If staggered, then the TE elements preferably remain in alignment while the connector sinks are preferably formed with offset or off-center fins.

Cold sink 46 is an anodized aluminum-finned heat sink of conventional construction, preferred for module 40. Other known forms of heat sink could be used, such as staked fin, folded fin, skived, and heat pipe, but may require means for electrically insulating the cold sink from connectors 44. Cold sink 46 acts not only as a heat exchanger, but also as a mechanical support and spacer. Cold sink 46 is preferably of one-piece construction, integrating the spacer and heat exchanger functions; however, multiple piece or composite construction could be used. Cold sink 46 is smaller than a comparable conventional cold sink such as 24 shown in FIG. 2, and is therefore less efficient. Although eliminating the cold side alumina substrate by anodizing the cold sink reduces cost it does not reduce thermal resistance, since the addition of thermal adhesive between the cold sink face 46c and connectors 44 (see FIG. 3A) to secure the connectors has approximately the same thermal resistance as the alumina substrate and thermal grease it replaces. The reduction in cost, the simplification of assembly, and the compactness of the cold sink, however, outweigh any slight loss in efficiency (depending on the size of the cold sink) since it is more important to have a low thermal-resistance heat sink on the hot side than on the cold side; the hot side must transfer to the ambient air (or other fluid) both the heat received through the cold sink and the power (heat) put into the TE elements. In a typical application such as a picnic cooler, the power-in to heat-pumping ratio is approximately 0.33, so that the hot sink must move four watts to every one watt moved through the cold sink.

Those skilled in the art will recognize that the inventive module 40 allows the use of a significantly smaller, lighter, more easily assembled heat pump assembly than with conventional TE modules. At the same time, overall heat pumping efficiency of one of modules 40 may approach that of much heavier, larger conventional assemblies such as 22 in FIG. 2, and allows the ability of a single conventional module to be surpassed when two or more modules 40 are used in a distributed array, for the same power input and at less cost and weight.

The adhesive bond between cold sink 46 and connector tabs 44 can be any of the many thermally conductive adhesives available, such as Loctite® 384. The bond line should be as thin as possible to reduce thermal resistance. The solder used to bond TE elements 42 to connectors 44 and connector sinks 46 can vary in composition, for example bismuth tin (BiSn), lead tin (PbSn) or other known high temperature solders. Use of PbSn solder requires the TE elements to have a diffusion barrier such as nickel, since otherwise the solder will contaminate the TE elements. For example, the diffusion barrier can be in the form of nickel-coated solderable elements, which are commercially available and prevent such contamination.

Figure 4:
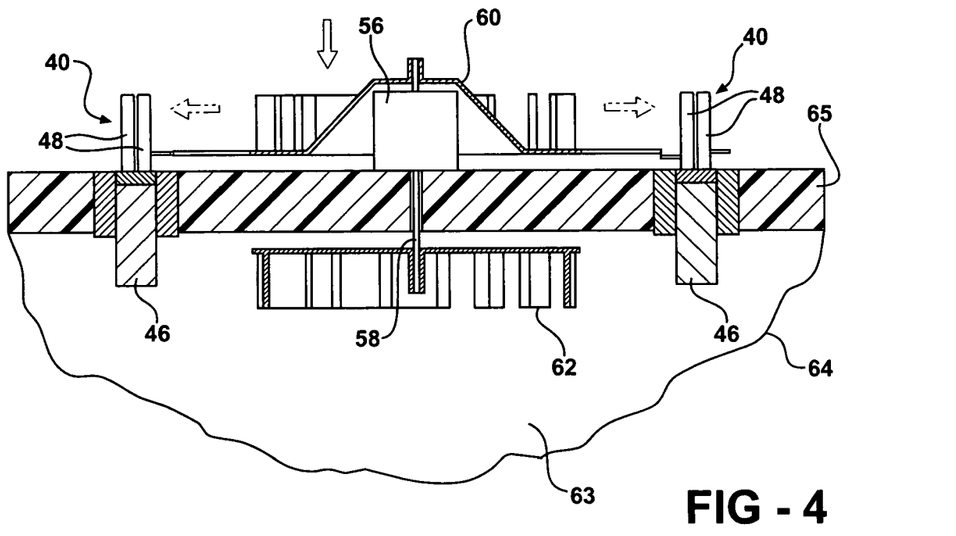
FIG. 4 is an end elevation view, in section, of an exemplary picnic cooler application of the TE module of FIG. 3.

Referring next to FIG. 4, a picnic cooler application using a pair of TE modules 40 is illustrated in section view. Two heat pump assemblies or modules 40 are mounted in the wall 65 of a portable thermoelectric cooler 64, on opposite sides of a hot side impeller fan 60 of known type. Fan 60 and its drive motor 56 can be the same fan assembly as commonly used in Igloo® brand thermoelectric picnic coolers, powered (along with modules 40) by a DC electrical power source such as the 12-volt cigarette lighter or power point plug in a vehicle. Fan 60 draws air in vertically (solid arrow) and redirects it in known fashion laterally (phantom arrows) toward modules 40, essentially perpendicular to elongated hot sink arrays 48. Known picnic cooler and similar cooling fan and TE module arrangements traditionally use a single TE module; the elongated modules 40 according to the invention lend themselves to multiple or surrounding combination with a multi-directional fan to increase the efficiency of the cooling operation.

Individually, modules 40 have been found to move heat as well as conventional modules with hot sinks as much as ten times heavier and taking up as much as four times the surface area. This is believed to result from the reduced thermal resistance achieved by eliminating the hot side alumina substrate and interface materials; from the replacement of the typical aluminum finned hot sink (see FIG. 2) with more-conductive copper connector sinks 48, preferably using electronic tough pitch (ETP) copper which has approximately twice the thermal conductivity of commonly used aluminum; and from the increase in cooling airflow volume through the elongated, narrow hot sink array. Airflow volume is further increased by using multiple smaller, lighter modules 40 around the fan assembly for bi-directional or multi-directional flow. The illustrated bi-directional flow, for example, reduces resistance to airflow and increases air volume using the same fan power. As air volume increases, the temperature rise of the air decreases and thereby lowers the effective heat sink resistance. And while a bidirectional, two-module arrangement is shown in the illustrated example, more modules or a longer, curved or angled single module could be used to more fully or even completely surround the fan assembly.

Still referring to FIG. 4, heat-absorption by cold sinks 46 of each module 40 can be improved by mounting a bi-directional fan 62 between them in the interior 63 of cooler 64, driven in common with fan 60 through a drive shaft 58 connected to motor 56. The ability to use distributed, multiple cold sinks with a single, central fan likewise improves the efficiency of heat transfer on the cold side of the system, at no additional cost in power.

Figure 5:
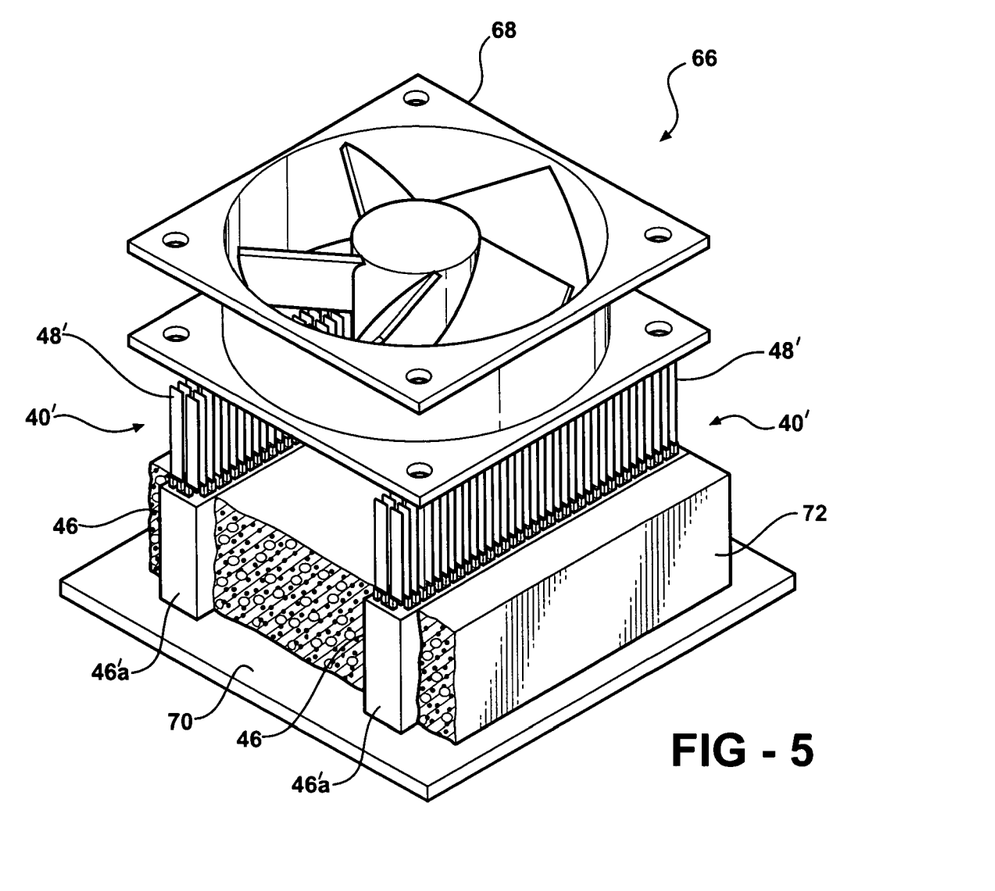
FIG. 5 is a perspective view of an exemplary temperature-controlled plate application of the TE module of FIG. 3.

Although FIG. 4 shows a picnic cooler example, many configurations are possible. FIG. 5 shows a cooling assembly 66 with a pair of modules 40' applied to a temperature-controlled plate 70. The cold sink 46' in each module differs from cold sink 46 in FIGS. 3 and 4 in that the fins have been replaced by an extended spacer portion 46a' connected to conduction plate 70. Insulation 72 (shown sectioned) fills the space between and around spacer portions 46a' of the modules. The air mover, a tubeaxial style fan 68, blows air down between modules 40'(and walls which would normally enclose the ends of the modules, the walls omitted for clarity), thus forcing the air to flow across the connector sink arrays 48' of modules 40'.

Figure 6:
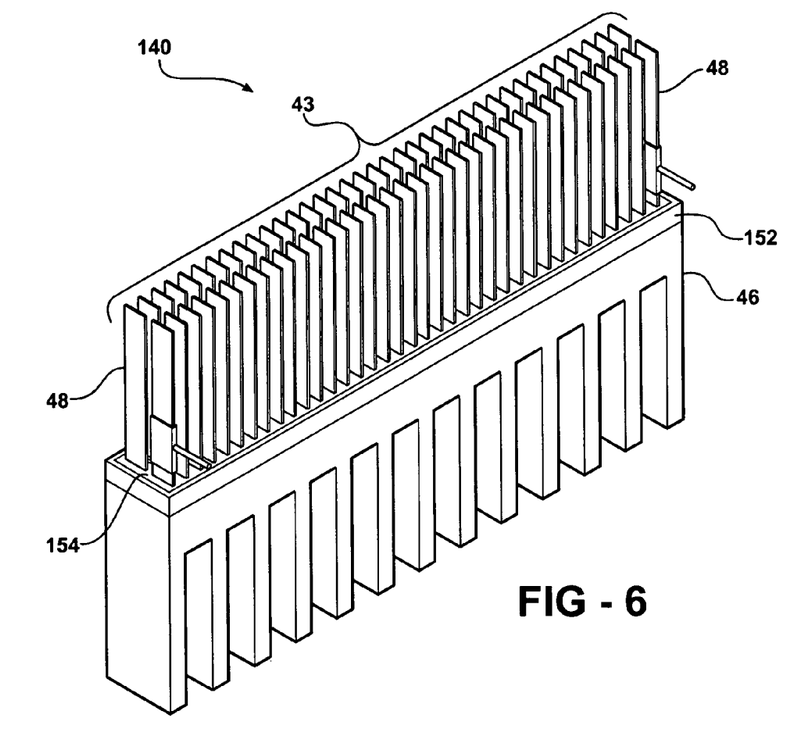
FIG. 6 is a perspective view of a TE module similar to FIG. 3, but modified with a cold-sink-based potting structure according to the invention.
Figure 6A:
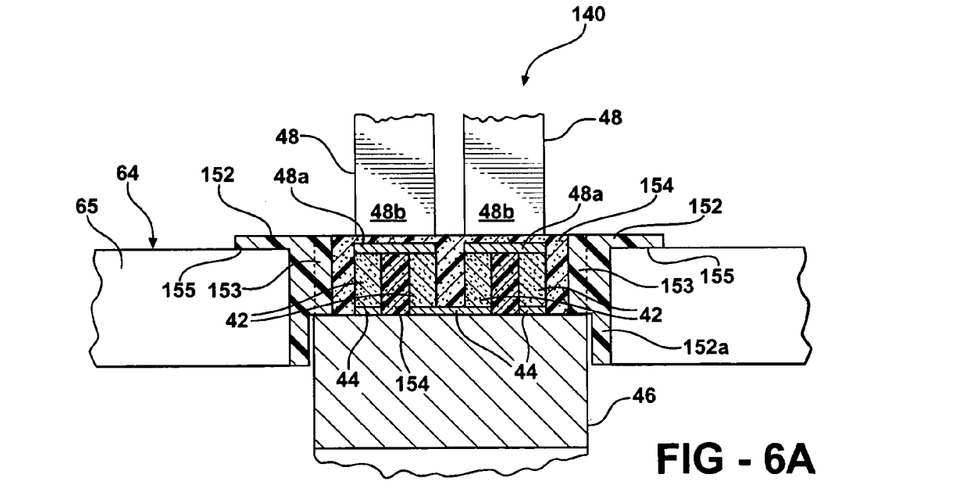
FIG. 6A is an end elevation view, in section, of the modified module of FIG. 6.

FIGS. 6 and 6A show an isometric and section view of a preferred embodiment for a sealed module similar to module 40 above, but designated 140 due to the addition of a potting guide 152 and potting or sealing material 154 which has been built up from cold sink 46 around the TE elements 42 and the bases 48a of connector sinks 48. In the illustrated embodiment, the preferred potting material is a UV curable epoxy, although other known electronic potting or encapsulating materials such as but not limited to acrylic, urethane, polyurethane, or hot-melt materials could be used. Additionally, for high temperature applications or generator applications, castable ceramics or cementaceous potting materials could be used. By "potting material" is meant a material that will both seal and support the connector bonds and TE elements. Some suitable potting materials may also have insulating properties.

Potting 154 reinforces the solder or other bonds between connectors 44, cold sink 46, and TE elements 42 and between connector sinks 48 and TE elements 42. The potting also prevents moisture from getting to the TE elements and connectors 44 and causing corrosion or thermal degradation. The potting is superior to the perimeter sealing techniques used in conventional TE modules 20, since the air spaces are filled, eliminating the formation of a vapor pressure differential. The potting also eliminates the need to seal interstitial voids around screws and wires. The open-topped nature of the supporting surface of cold sink 46 and any potting guide such as 152 allows easy application of the potting material 154, for example by injection, and further allows for fast and complete UV curing since shadow areas are eliminated.

Potting material tends to be more thermally conductive than foam insulation or air, and will cause an increase in parasitic heat flowing from the hot side back to the cold side, reducing efficiency. This is easily mitigated by using slightly larger (taller) TE elements 42 to increase the distance between the hot and cold sides, thereby reducing heat transfer. It is further mitigated by the fact that the exposed surface of the potting material 154 is in contact with the air passing through the connector sinks, where the air is only a few degrees warmer than the ambient temperature. It is preferred that the sides of the potting guide and layer be insulated, for example by placing the insulation in the cooler appliance's wall against the sides of the potting guide. Conventional modules such as 20 place the air space in the module in contact with the hot side substrate at the elevated temperature of the hot sink, typically 15° C. above ambient in a picnic cooler application.

FIG. 6A shows the potting guide 152 in a preferred form, in contact with and supported on the cold sink 46. Guide 152 is located in the vertical or z-direction by discontinuous ribs or a continuous interior step 153, and in the x- and y-directions by the walls 152a of the guide. A flange 155 locates the assembly 140 on the insulated wall 65 of a cooled enclosure or picnic box 64 as seen in FIG. 4. Illustrated potting guide 152 is a molded plastic, and can be held in place with additional fasteners such as adhesive or snaps. The potting guide can be designed to be left in place as part of the potting structure, as shown, or could be temporary or removable, such as a PTFE mold that does not stick to the potting material and that is applied only during the manufacturing process.

Figure 7:
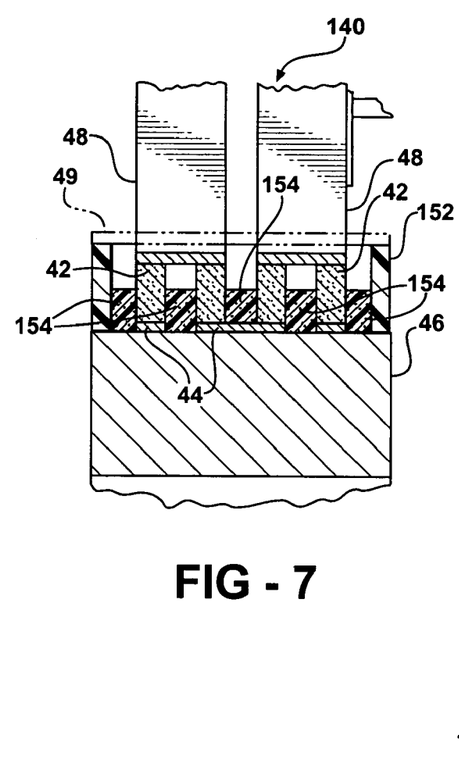
FIG. 7 is an end elevation view, in section, of the TE module of FIG. 6, with a modified potting structure.
Figure 8:
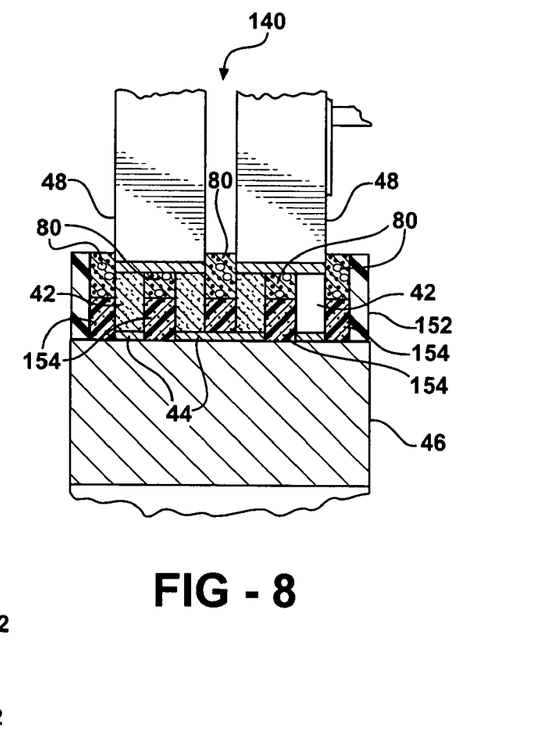
FIG. 8 is similar to FIG. 7, but with an insulating layer on top of the modified potting structure.

Between the basic, open, unpotted module assembly 40 of FIGS. 1-5 and the fully sealed, potted module assembly 140 of FIGS. 6 and 6A lie many different ways of partially or filly sealing the module, which as noted above lends itself well to a variety of sealing methods. FIGS. 7 and 8, for example, show modified forms of the potting structure of FIG. 6, in which the potting material 154 extends from cold sink 46 past connectors 44 but only partway up the TE elements 42, such that the connection between connector sinks 48 and TE elements 42 is unsealed, but with an optional cover 49 (phantom lines) placed over the hot side connection and the potting guide 152. The cover prevents air that is passing through or down upon connector sinks 48 from entering the spaces between TE elements 42, reducing heat gain to cold sink 46 and improving efficiency. The cover could be paper, plastic, plastic-coated paper or any electrically non-conductive material, with perforations or holes for the connector sink fins 48b to pass through. Cover 49 can be attached to potting guide 152 with adhesive, molded snaps, or in other known manner.

FIG. 8 is similar to FIG. 7, but with a foam insulation layer 80 built on top of potting layer 154. The potting prevents moisture form condensing on the cold side of the elements and the foam insulation reduces heat gain to the cold sink. An additional moisture sealant can be placed on top of the foam insulation layer 80.

Figure 9:
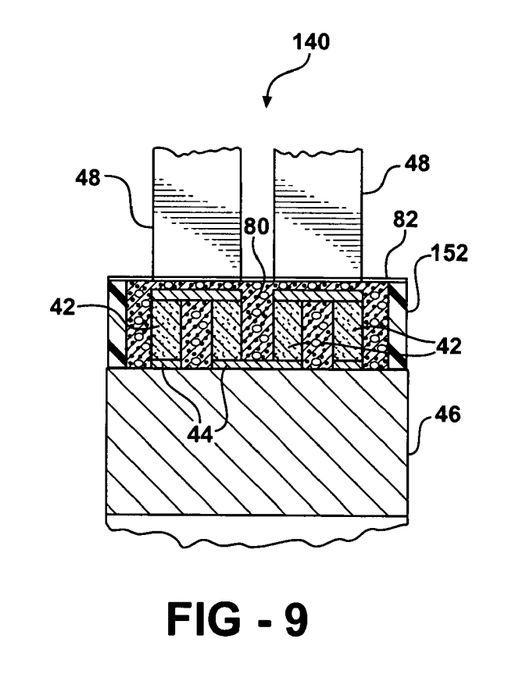
FIG. 9 is similar to FIG. 6, but with the potting structure made from a sealed insulator such as foam rather than traditional potting material.

FIG. 9 shows the potting material of full potting layer 154 of FIGS. 6 and 6A replaced with foam insulation 80, built up from cold sink 46, filling the volume defined by potting guide 152, and fully surrounding the TE elements 42 and their connections with connectors 44 and connector sinks 48. The foam is provided with a thin moisture barrier 82, in the illustrated embodiment a plastic-coated metal film. The film has perforations or holes to allow fins 48b of connector sinks 48 to pass through. The film 82 could be held in place, for example, on top of potting guide 152 while foam 80 is injected into the guide onto cold sink 46, and thereafter adhered to the foam. It will be understood that other types of moisture barrier could be used on the foam.

Figure 10:
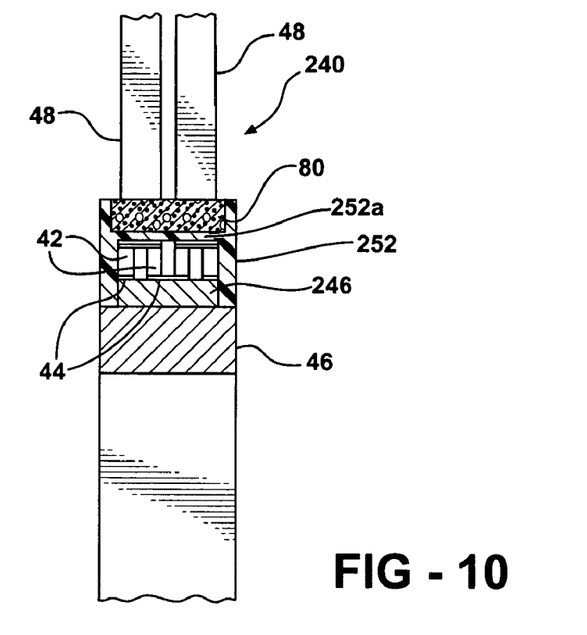
FIG. 10 is an end elevation view, in section, of the TE based module of FIG. 3, with a cold-sink-based airtight surround supporting a potting layer.

FIG. 10 shows a module assembly 240, in which a raised potting guide 252 is bonded to cold sink 46 and has an internal partition 252a located above the junction of connector sinks 48 and TE elements 42, sealing the TE elements and their connectors from the ambient in airtight fashion. Connector sink fins 48b protrude through partition 252a, sealed with epoxy or by insert-molding, for example. A layer of potting material or insulating foam 80 is supported on the partition, and in the case of potting material or a sealed foam can eliminate the need to seal connector sink fins 48b where they exit the partition. Cold side connectors 44 are bonded to a metal spacer 246, which can be a separate piece attached to cold sink 46 or can be an integrally machined or cast extension of sink 46. Spacer 246 is not necessary, but is preferred to increase the length and circuitousness of the bond interface with the potting guide, thereby improving the seal between them. The airtight space 242 around the TE elements 240 can be filled with an inert gas such as argon, which is 34% less conductive than air, for example by assembly in a chamber filled with argon.

Figure 11:
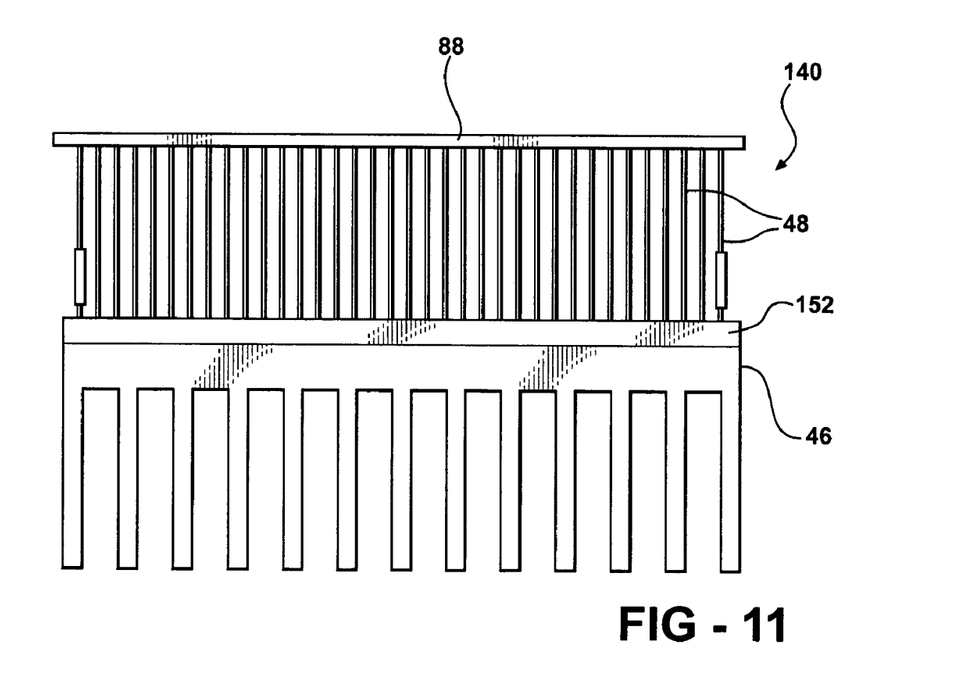
FIG. 11 is a front elevation view of the TE module of FIG. 3, with an insulating cover placed on top of the hot sink array.

Referring to FIG. 11, a module 140 as described above is shown with a protective support cover or shroud 88 for the free ends of connector sinks 48. Cover 88 is attached to the connector sinks by use of adhesive, for example, and can be made from plastic or other electrically non-conductive materials such as flexible foam. Cover 88 prevents connector sinks 48 from contacting each other or other conductive objects which could cause an electrical short circuit. Cover 88 also acts as a vibration damper for the connector sinks.

It will be understood from the foregoing examples of preferred embodiments of the invention that various changes can be made, without departing from the scope of the invention as defined by the following claims, now that I have disclosed the invention by these examples, and that the claimed invention is accordingly not to be limited to these preferred embodiments and specific examples.

I claim:

1. A thermoelectric heat pump module comprising:
a plurality of spaced thermoelectric elements, the thermoelectric elements comprising first ends connected in pairs by electrically and thermally conductive cold-side connectors, the thermoelectric elements comprising second opposite ends connected in pairs by electrically and thermally conductive hot-side connector sinks comprising extended, spaced heat exchange portions forming a hot sink array, the cold-side connectors connected to and supported by a rigid, unitary cold sink, further comprising potting material extending from the cold sink to a point beyond the cold-side connectors, the potting material sealing and supporting the first ends of the thermoelectric elements and the cold-side connectors, wherein the cold-side connectors are connected to a support surface of the cold sink whose area is greater than an area bounded by the thermoelectric elements, and wherein the potting material is built up from the support surface around the cold-sink supported cold-side connectors to form an additional support for the thermoelectric elements and connectors.

2. The thermoelectric module of claim 1, further comprising a potting guide supported on the support surface of the cold sink and surrounding side surfaces of the potting material.

3. The thermoelectric module of claim 1, wherein a potting guide is supported on the support surface of the cold sink surrounding the potting material, the potting guide comprising a raised potting support surface located above the TE elements and supporting a layer of potting material.

4. A thermoelectric heat pump module comprising:
a plurality of spaced thermoelectric elements, the thermoelectric elements comprising first ends connected in pairs by electrically and thermally conductive cold-side connectors, the thermoelectric elements comprising second opposite ends connected in pairs by electrically and thermally conductive hot-side connector sinks comprising extended, spaced heat exchange portions forming a hot sink array, the cold-side connectors connected to and supported by a rigid, unitary cold sink wherein the thermoelectric elements and their connector sinks are arranged in an elongated array of rows on the cold sink, the rows having a length greater than a width of the array.

5. The thermoelectric module of claim 4, wherein the elongated array is rectangular.

6. The thermoelectric module of claim 4, wherein the extended heat exchange portions of the connector sinks are parallel to one another.

7. The thermoelectric module of claim 6, wherein the extended heat exchange portions in one row are aligned with the extended heat exchange portions in an adjacent row.

8. The thermoelectric module of claim 6, wherein the extended heat exchange portions comprise fin members.

9. The thermoelectric module of claim 8, wherein the extended heat exchange portions comprise planar fin members.

10. A thermoelectric heat pump module comprising:
a plurality of spaced thermoelectric elements, the thermoelectric elements comprising first ends connected in pairs by electrically and thermally conductive cold-side connectors, the thermoelectric elements comprising second opposite ends connected in pairs by electrically and thermally conductive hot-side connector sinks comprising extended, spaced heat exchange portions forming a hot sink array, the cold-side connectors connected directly to and supported by a rigid, unitary cold sink, wherein free ends of the hot sink array are connected by an electrically insulative cover.

11. A thermoelectric heat pump assembly for small cooling appliances, comprising:
a fan for generating a flow of cooling air;
a thermoelectric heat pump module comprising a plurality of spaced thermoelectric elements, the thermoelectric elements comprising first ends connected in pairs by electrically and thermally conductive cold-side connectors, the thermoelectric elements comprising second opposite ends connected in pairs by electrically and thermally conductive hot-side connector sinks comprising extended, spaced heat exchange portions comprising a hot sink array, the cold-side connectors connected directly to and supported by a rigid, unitary cold sink, the thermoelectric elements and their connector sinks arranged in an elongated array of rows on the cold sink, the rows having a length greater than a width of the array;
the heat pump module being arranged relative to the fan to receive the flow of cooling air perpendicular to the elongated hot sink array.

12. The thermoelectric heat pump assembly of claim 11, wherein a second thermoelectric heat pump module is arranged relative to the fan to receive the flow of cooling air in a perpendicular fashion.

13. The thermoelectric heat pump assembly of claim 11, wherein one or more heat pump modules are arranged surrounding the fan.

* * * * *